United States Patent
Inoue et al.

(10) Patent No.: US 10,271,436 B2
(45) Date of Patent: Apr. 23, 2019

(54) COMPONENT MOUNTING METHOD

(71) Applicant: Panasonic Intellectual Property Management Co., Ltd., Osaka (JP)

(72) Inventors: Ryota Inoue, Yamanashi (JP); Naoki Azuma, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 356 days.

(21) Appl. No.: 14/983,264

(22) Filed: Dec. 29, 2015

(65) Prior Publication Data

US 2016/0255752 A1 Sep. 1, 2016

(30) Foreign Application Priority Data

Feb. 26, 2015 (JP) .................... 2015-036520

(51) Int. Cl.
*H05K 3/30* (2006.01)
*H05K 13/04* (2006.01)
*H05K 13/08* (2006.01)

(52) U.S. Cl.
CPC .......... *H05K 3/301* (2013.01); *H05K 13/046* (2013.01); *H05K 13/0813* (2018.08)

(58) Field of Classification Search
CPC ........ H05K 13/00; H05K 13/02; H05K 13/04; H05K 13/0417; H05K 13/08; H05K 3/301; H05K 13/046; H05K 13/0813
See application file for complete search history.

(56) References Cited

U.S. PATENT DOCUMENTS

| | | | | |
|---|---|---|---|---|
| 4,675,993 A * | 6/1987 | Harada | ............... | G05B 19/4083 228/105 |
| 4,747,198 A * | 5/1988 | Asai | ................... | H05K 13/022 29/407.04 |
| 5,878,484 A * | 3/1999 | Araya | ................. | H05K 13/0413 29/721 |
| 6,931,716 B2 * | 8/2005 | Suhara | .................. | H05K 13/08 29/720 |
| 6,971,158 B2 * | 12/2005 | Terui | .................. | H05K 13/0061 29/739 |
| 7,458,147 B2 * | 12/2008 | Kawase | ............. | H05K 13/0408 29/832 |

(Continued)

FOREIGN PATENT DOCUMENTS

| | | |
|---|---|---|
| JP | 3617483 B2 | 2/2005 |
| JP | 2012-042670 A | 3/2012 |
| JP | 2012-243713 A | 12/2012 |

*Primary Examiner* — Carl Arbes

(57) ABSTRACT

A component mounting method is provided for mounting a light emitting component on a board by picking up the light emitting component from a pocket formed in a carrier tape by a mount head. The method includes recognizing a reference part formed in the board, recognizing a light emitting part of the light emitting component by imaging the light emitting component from above in a state where the light emitting component is held within the pocket by a holder from below, picking up the light emitting component by the mount head in the state where the light emitting component is held within the pocket by the holder from below, and mounting the picked up light emitting component on the board based on a recognition result of the reference part and a recognition result of the light emitting part.

2 Claims, 11 Drawing Sheets

(56) References Cited

U.S. PATENT DOCUMENTS 8,634,079 B2 * 1/2014 Onishi .................. H05K 13/08
356/446
8,707,548 B2 * 4/2014 Abe .................. H05K 13/0413
29/720

* cited by examiner

IVB-IVB ARROW VIEW

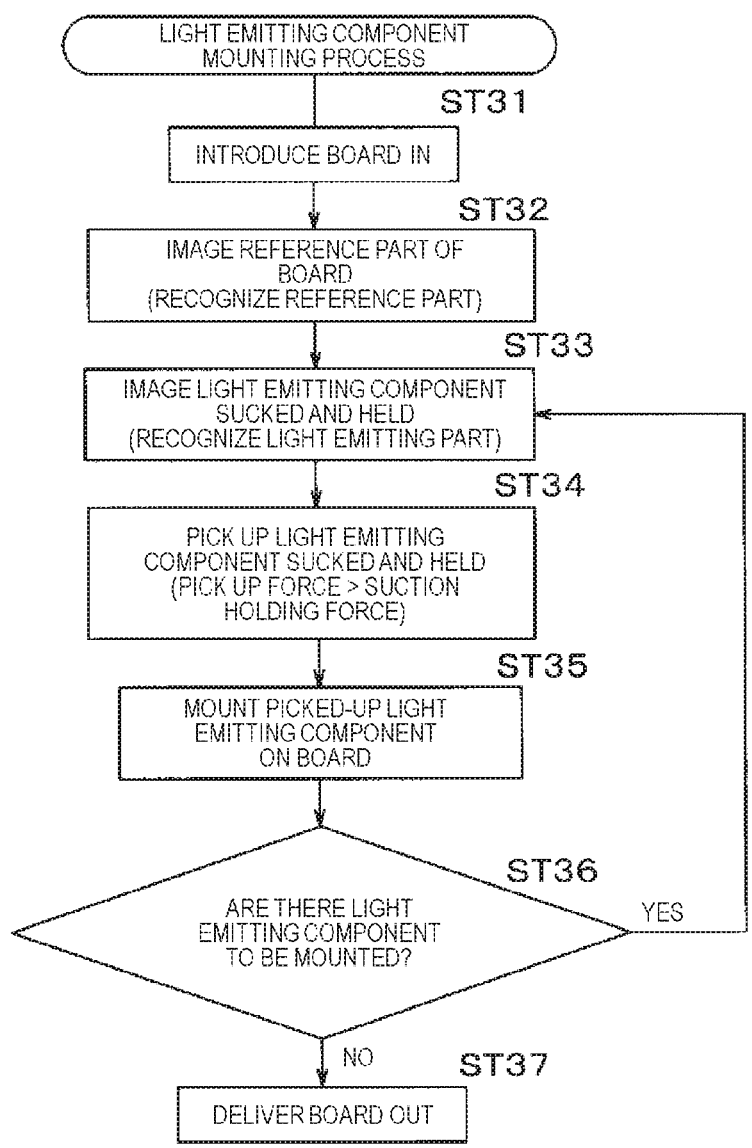

COMPONENT MOUNTING METHOD

CROSS-REFERENCES TO RELATED APPLICATION(S)

This application is based on and claims priority from Japanese Patent Application No. 2015-36520 filed on Feb. 26, 2015, the entire contents of which are incorporated herein by reference.

BACKGROUND

1. Field of the Invention

The present invention relates to a component mounting method and a component mounting apparatus for mounting a light emitting component on a board by taking out the light emitting component from a carrier tape.

2. Description of Related Art

In recent years, as a lighting apparatus, a lighting board of which a light source is a light emitting component such as an LED has been widely used (see JP-A-2012-42670 and JP-A-2012-243713 as Patent Documents 1 and 2). A plurality of light emitting components are mounted on the lighting board in a predetermined arrangement and quality requirements of the lighting board are that the light emitting components are arranged at precise positions in the lighting board as a finished product. Particularly, when an exterior of the lighting board and the like to be mounted on a vehicle is important, it is required to precisely dispose a light emitting part of the light emitting component at a predetermined position in a manufacturing process of the lighting board.

However, in the light emitting component, variation exists in a positional relationship between an actual position of the light emitting part and an original reference position at which the light emitting part should be positioned because of an error in the manufacturing process. Thus, in order to manufacture the lighting board that meets the quality requirements described above, it is not possible to use the reference position defined by the exterior and the like without change, as a reference of positioning when mounting the light emitting component on the board. As described above, as a technique of mounting the component which has characteristics in which the positional relationship between an actual functional position and the original reference position has variation, on the board while precisely arranging the functional position, a method of positioning the component based on a recognition result of optical recognition of the component in a mounting process has been known (for example, see Japanese Patent No. 3617483 as Patent Document 3).

In Japanese Patent No. 3617483, when mounting an electronic component on the board by picking up the electronic component by a transfer head, first, a first recognizing process is performed, in which the electronic component before being held in the transfer head is imaged and recognized by a first camera from an active surface side (upper surface side), and then the transfer head picks up the electronic component by being positioned to the electronic component based on a result of detecting the exterior of the electronic component and an active surface position. Next, a second recognizing process of recognizing the electronic component picked up by the transfer head is performed by imaging and recognizing the electronic component from a rear surface side (lower surface side) by a second camera, and thereby the exterior of the electronic component is detected. Then, when positioning the active surface of the electronic component to the board, a position shift error of the electronic component occurring when picking up the electronic component is corrected based on a detection result in the first recognizing process and a detection result in the second recognizing process.

Patent Document 1: JP-A-2012-42670
Patent Document 2: JP-A-2012-243713
Patent Document 3: Japanese Patent No. 3617483

SUMMARY

However, as in the related art described above, in a method of performing a position correcting process based on a result of imaging and recognizing of the component within the component mounting apparatus, there is a drawback as follows. First, in a component mounting operation for the light emitting component, recognition of the component within the component mounting apparatus is performed by imaging and recognizing (first recognizing process) the light emitting component from the upper surface side in a state where the light emitting component has been supplied to a pick-up position by a tape feeder. Since the light emitting component is in a state of being simply accommodated within a pocket of the carrier tape in the first recognizing process, the position of the light emitting component is not stable and the recognition result of the first recognizing process obtained in this state cannot be used without a change for position correction in component mounting. Thus, it is necessary that the light emitting component that is held by a suction nozzle is imaged and recognized (second recognizing process) from the lower surface side by moving a mount head in the up direction of the component recognition camera, which takes the light emitting component out from the tape feeder by sucking and holding the light emitting component by the suction nozzle, and the position shift error of the electronic component occurring when picking up the electronic component is corrected based on the detection result in the first recognizing process and the detection result in the second recognizing process.

That is, as in the related art described above, when performing the second recognizing process for imaging and recognizing the light emitting component from the lower surface side in addition to the first recognizing process for imaging and recognizing the light emitting component from the upper surface side in the mounting process, it takes time for the imaging and recognizing process of the light emitting component and there is a drawback that a lowering of productivity is caused. Furthermore, for the light emitting component, in a case where both a body section of the light emitting component and the carrier tape are black, even if the light emitting component is imaged from the upper surface side, there is a problem that it is difficult to optically recognize the exterior of the component. Furthermore, since differences often occur in the exteriors of the upper surface and the lower surface due to cut-shape precision in a process of a cutting and separating the light emitting component into individual pieces, there is a problem that it is difficult to sufficiently secure the mounting precision even if the recognition is performed with respect to the light emitting component from the lower surface side in addition to the recognition from the upper surface side.

Then, a non-limited object of one or more aspects of the present invention is to provide a component mounting method and a component mounting apparatus in which mounting precision can be secured without performing recognition of a light emitting component from a lower surface side even for the light emitting component in which variation exists in a position of a light emitting part.

An aspect of the present invention provides a component mounting method for mounting a light emitting component on a board by picking up the light emitting component from a pocket formed in a carrier tape by a mount head, the method including: recognizing a reference part formed in the board; recognizing a light emitting part of the light emitting component by imaging the light emitting component from above in a state where the light emitting component is held within the pocket by a holder from below; picking up the light emitting component by the mount head in the state where the light emitting component is held within the pocket by the holder from below; and mounting the picked up light emitting component on the board based on a recognition result of the reference part and a recognition result of the light emitting part.

Another aspect of the present invention provides a component mounting apparatus for mounting a light emitting component on a board by picking up the light emitting component from a pocket formed in a carrier tape by a mount head, the apparatus including: a component supply device that supplies the carrier tape to a pick-up position of the mount head; a holder in the component supply device that holds the light emitting component within the pocket from below; a reference part recognizer that recognizes a reference part formed in the board; a light emitting part recognizer that recognizes a light emitting part of the light emitting component by imaging the light emitting component from above in a state where the light emitting component is held within the pocket by the holder from below; and a mounting controller that picks up the light emitting component with the mount head in the state where the light emitting component is held and mounts the light emitting component on the board, by controlling an operation of the mount head based on a recognition result of the reference part by the reference part recognizer and a recognition result of the light emitting part by the light emitting part recognizer.

In the aspects of the present invention, even for the light emitting component in which variation exists in the position of light emitting part, it may be possible to secure mounting precision without performing recognition of the light emitting component from the lower surface side.

BRIEF DESCRIPTION OF THE DRAWINGS

FIG. 9 is a flow diagram of a mounting process of the light emitting component in the component mounting method according to an embodiment of the present invention.

DETAILED DESCRIPTION

Figure 1:
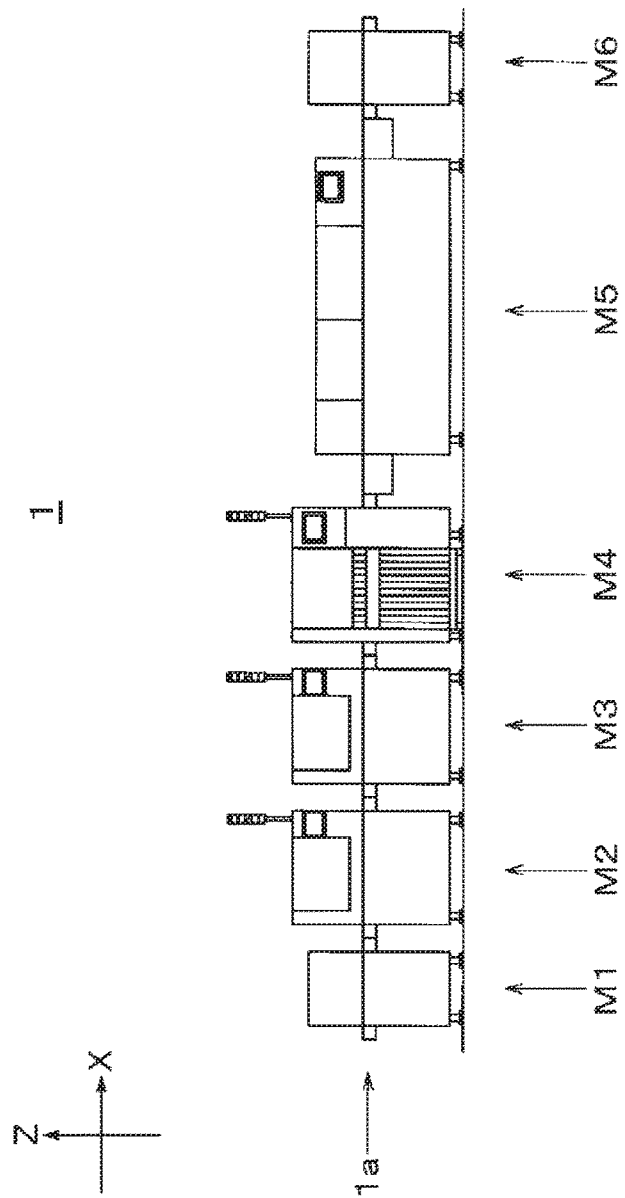
FIG. 1 is an explanatory view of a configuration of a component mounting system according to an embodiment of the present invention.

Next, an embodiment of the present invention will be described with reference to the accompanying drawings. First, a configuration of a component mounting system 1 will be described with reference to FIG. 1. The component mounting system 1 has a function of producing a lighting board by mounting a light emitting component such as an LED to a board by soldering. The component mounting system 1 has a component mounting line 1a as a main body which is configured by connecting a screen printing device M2, an adhesive application device M3, a component mounting apparatus M4, and a reflow device M5 in series between a board supply device M1 having a function of providing a board of a mounted target and a board recovering device M6 having a function of recovering a mounted board.

Board transport sections including each device of the component mounting line 1a are connected in series and form a board transport path having the same pass line. In a component mounting operation, an operation of mounting a component for mounting a light emitting component 20 (see FIGS. 6A to 6C, 7A to 7C, and 8) is performed with respect to a board 3 (see FIGS. 2 and 6A to 6C) transported along the board transport path by the screen printing device M2, the adhesive application device M3, the component mounting apparatus M4, and the reflow device M5.

Figure 8:
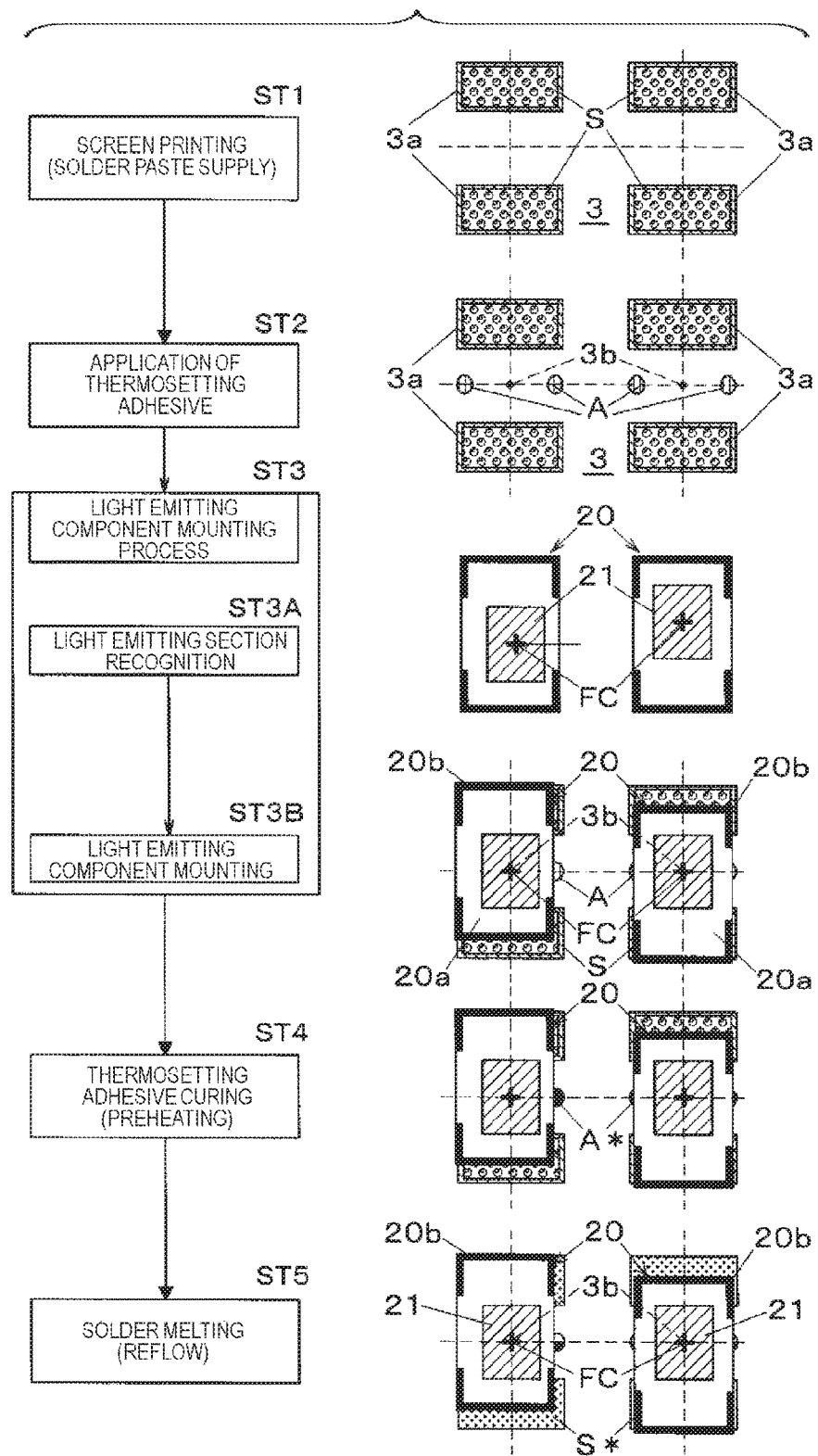
FIG. 8 is an explanatory view of processes illustrating the component mounting method according to an embodiment of the present invention.

That is, the board 3 supplied by the board supply device M1 is introduced into the screen printing device M2 and here, a screen printing operation for printing solder paste S for component bonding which is printed on the board 3 is performed (see FIG. 8). The board 3 after screen printing is passed to the adhesive application device M3 and here, adhesive A (see FIG. 8) for fixing the light emitting component 20 to the board 3 is applied to a predetermined coating position. The board 3 after adhesive application is passed to the component mounting apparatus M4 and the component mounting operation for mounting the light emitting component 20 on the board 3 after the solder paste S is printed and the adhesive A is applied.

The board 3 after mounting the component is introduced into the reflow device M5 and here, is heated according to a predetermined heating profile. That is, first, preheating is performed to cure the thermosetting adhesive A applied in the adhesive application device M3. Thus, the light emitting component 20 is fixed to the board 3 in a state of being held at a position during mounting. Next, main heating for soldering is performed. In this case, the light emitting component 20 is in a state of being fixed to the board 3 by the adhesive A, in this state, solder in the solder paste S is melted and solidified, and thereby a terminal of the light emitting component 20 and a land 3a of the board 3 are electrically and mechanically connected. Thus, the lighting board, on the board 3 of which the light emitting component 20 is mounted, is completed and is recovered to the board recovering device M6.

In the configuration described above, in the embodiment, the reflow device M5 functions as an adhesive curing section for fixing the light emitting component 20 to the board 3 by curing the adhesive A applied in the adhesive application device M3 and functions as a reflow section for electrically and mechanically connecting the terminal of the light emitting component 20 and the land 3a of the board 3 by melting the solder in the solder paste S in a state where the light emitting component 20 is fixed to the board 3 by the cured adhesive A.

In the embodiment, as the adhesive A, thermosetting adhesive of which a peak of a curing reaction reaches at a temperature lower than a melting point of the solder in the solder paste S, for example, thermosetting adhesive of which the peak of the curing reaction that is measured by differential scanning calorimetry measurement appears at a temperature lower than the melting point of the solder is used. Correspondingly, the adhesive curing section described above is a preheating section for heating the board 3 to a temperature less than the melting point of the solder and a temperature or higher for accelerating the curing reaction of the thermosetting adhesive, and the reflow section described above is a form to continuously heat the board 3 to the melting point or more of the solder from the preheating section. Such a heating form is realized by a heating profile setting function included in the reflow device M5.

Moreover, as the adhesive applied in the adhesive application device M3, light-curable adhesive having UV curable resin and the like as components may be used instead of the thermosetting adhesive. In this case, as the adhesive curing section for fixing the light emitting component 20 to the board 3 by curing the adhesive applied in the adhesive application device M3, a light irradiation section such as a UV irradiation device for applying light for accelerating curing of the thermosetting adhesive is disposed on an upstream side of the reflow device M5 or an inside of the reflow device M5.

Figure 2:
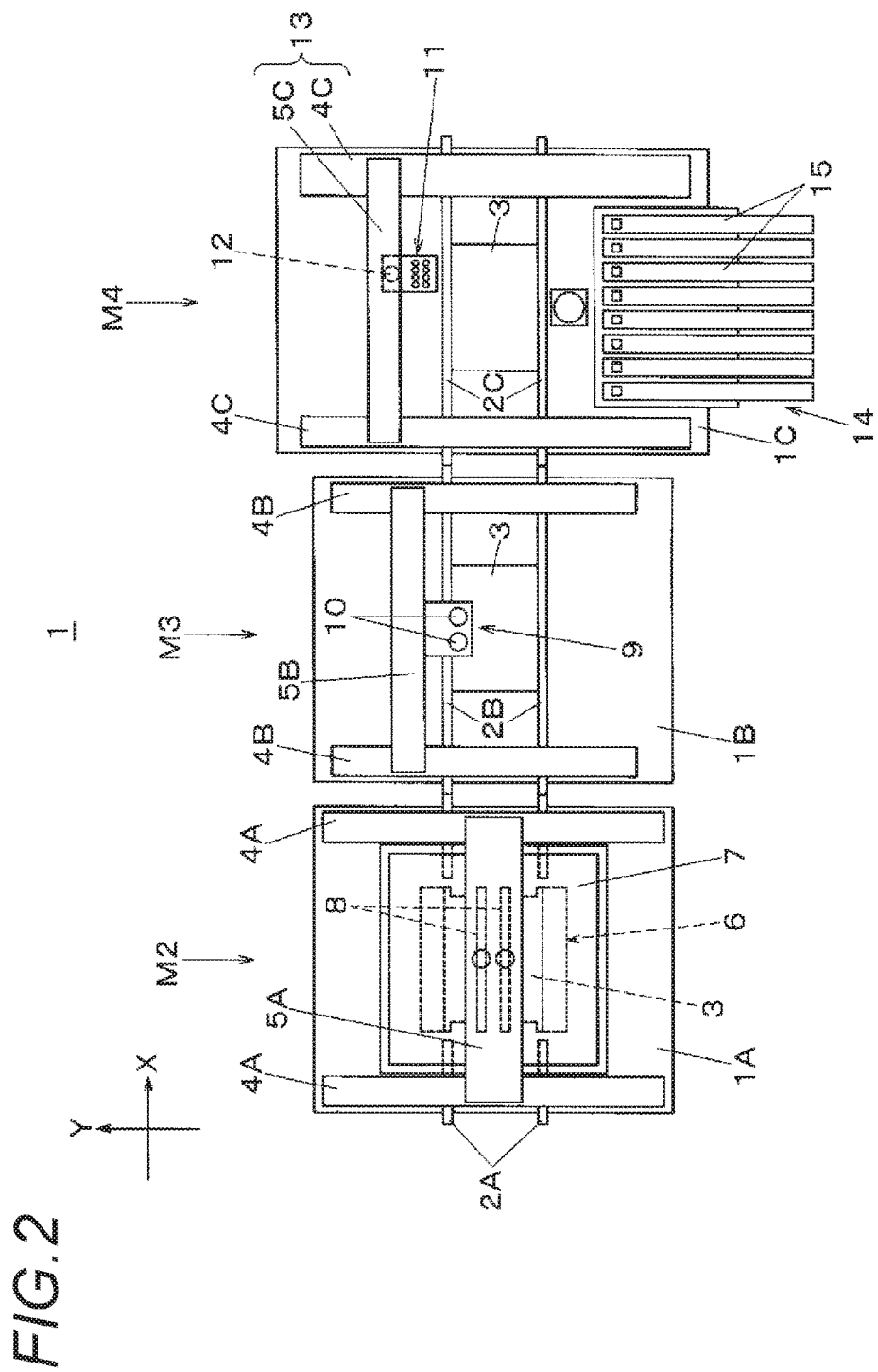
FIG. 2 is a plan view of a part of the component mounting system according to an embodiment of the present invention.

Next, configurations of the screen printing device M2, the adhesive application device M3, and the component mounting apparatus M4 will be described with reference to FIG. 2. In FIG. 2, board transport mechanisms 2A, 2B, and 2C are arranged in series in the board transport direction (X-direction) at centers of bases 1A, 1B, and 1C which are respectively provided in the screen printing device M2, the adhesive application device M3, and the component mounting apparatus M4, and form the board transport path for transporting the board 3 in the component mounting system 1.

Y axis moving mechanisms 4A, 4B, and 4C are respectively erected on both end portions on upper surfaces of the bases 1A, 1B, and 1C in a Y-direction. A squeegee table 5A and X axis moving mechanisms 5B and 5C are respectively laid between the Y axis moving mechanisms 4A, 4B, and 4C to be movable in the Y-direction. The Y axis moving mechanism 4B, the X axis moving mechanism 5B, the Y axis moving mechanism 4C, and the X axis moving mechanism 5C configure an operation head moving mechanism for moving an operation head performing a mounting operation of each component described below in the adhesive application device M3 and the component mounting apparatus M4.

The screen printing device M2 includes a board positioning section 6 for positioning and holding the board 3. The board positioning section 6 positions the board 3 introduced into the screen printing device M2 through the board transport mechanism 2A with respect to a screen mask 7 disposed above the board positioning section 6. A squeegee head 8 for screen printing is disposed on a lower surface of the squeegee table 5A so as to be vertically movable with respect to the screen mask 7. The squeegee head 8 performs the screen printing operation sliding on an upper surface of the screen mask 7 in the Y-direction by driving the Y axis moving mechanism 4A in a state where the squeegee head 8 is lowered.

Figure 6A:
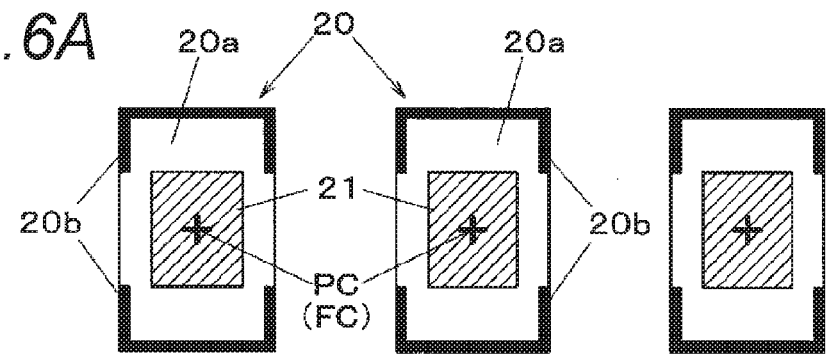
FIGS. 6A to 6C are explanatory views of a reference of mounting positioning in a component mounting method according to an embodiment of the present invention.
Figure 6B:
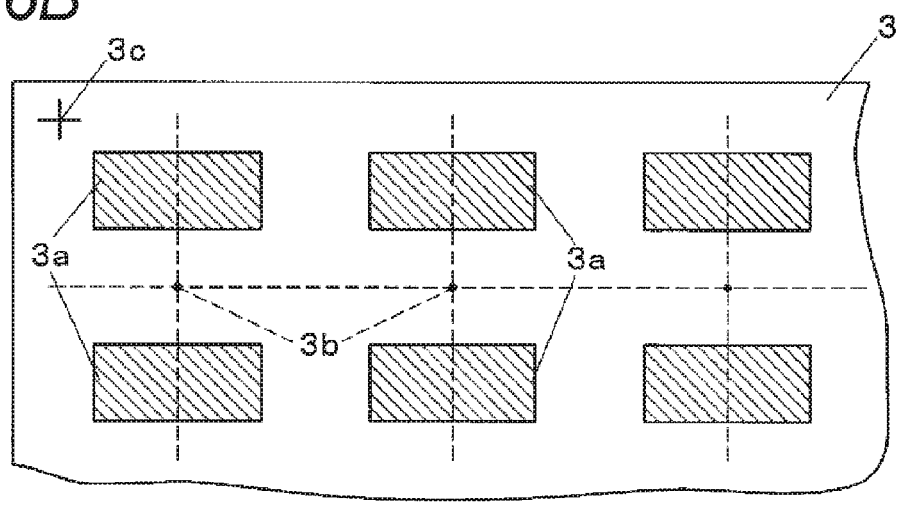
Figure 6C:
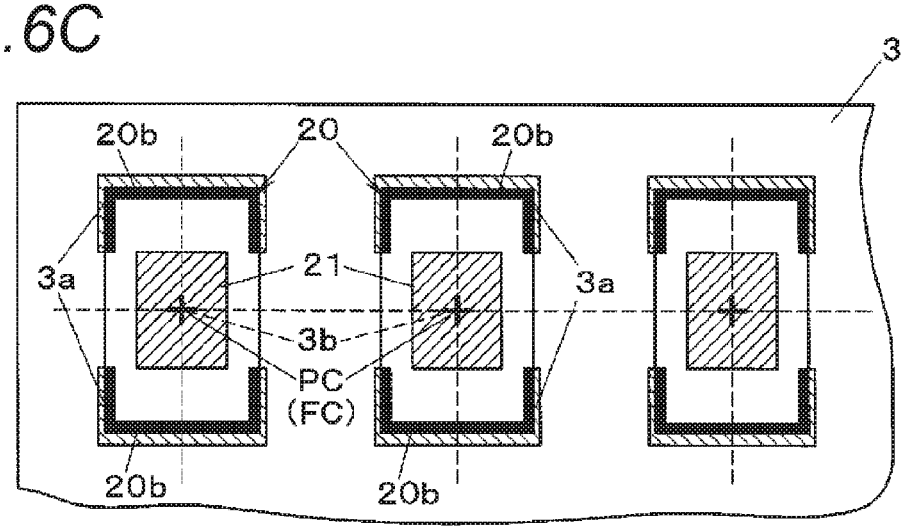

Pattern holes (not illustrated) are formed in the screen mask 7 corresponding to solder printing portions (see the lands 3a in pairs formed on the upper surface of the board 3 in FIGS. 6A to 6C) in the board 3. In a state where the board 3 held in the board positioning section 6 abuts a lower surface of the screen mask 7, the screen printing operation is performed in the squeegee head 8 on the screen mask 7 to which the solder paste S is supplied. Thus, the solder paste S for component bonding is printed by screen printing in the land 3a of the board 3. That is, the screen printing device M2 is a solder paste supply section for supplying the solder paste S to the lands 3a in pairs formed on the upper surface of the board 3.

The board transport mechanism 2B of the adhesive application device M3 introduces and positions the board 3 to which the solder paste S is printed. A coating head 9 including a dispenser 10 discharging the adhesive A is mounted on the X axis moving mechanism 5B. It is possible to apply the adhesive A at a predetermined coating position on the upper surface of the board 3 by positioning the coating head 9 with respect to the board 3 by driving the Y axis moving mechanism 4B and the X axis moving mechanism 5B. In the embodiment, the thermosetting adhesive A for fixing the light emitting component is applied to the coating position that is set between the lands 3a in pairs on the board 3 prior to mounting the light emitting component 20 on the board 3 (see FIG. 8). That is, the adhesive application device M3 is an adhesive coating section for applying the adhesive for fixing the light emitting component to the board 3 between the lands 3a in pairs on the board 3.

The board transport mechanism 2C of the component mounting apparatus M4 introduces and positions the board 3 to which the adhesive is applied. A component supply section 14 in which a plurality of tape feeders 15 are arranged is provided on one side of the board transport mechanism 2C. The tape feeder 15 supplies the light emitting component to a pick-up position by a component mount head 11 by pitch-feeding a carrier tape 16 (see FIG. 3), within a pocket 16b of which the light emitting component 20 that is the component to be mounted is held. Then, the light emitting component 20 is taken out from the pocket 16b and is mounted on the board 3 by the component mount head 11 (mount head) included in the component mounting apparatus M4.

The component mount head 11 including a plurality of suction nozzles 11a (see FIG. 3) for sucking and holding the light emitting component 20 is mounted on the X axis moving mechanism 5C. A board recognition camera 12 integrally moving with the component mount head 11 is provided on the lower surface of the X axis moving mechanism 5C. The Y axis moving mechanism 4C and the X axis moving mechanism 5C configure a mount head moving mechanism 13 for moving the component mount head 11. The component mount head 11 is movable to an arbitrary position above the component supply section 14 and the board 3 together with the board recognition camera 12 by driving the mount head moving mechanism 13.

The component mount head 11 moves to above the board 3 and then a recognition target such as a board recognition mark 3c set to the upper surface of the board 3 (see FIG. 7B) is imaged by the board recognition camera 12. Furthermore, the component mount head 11 moves to above the component supply section 14 and then it is possible to take out the light emitting component 20 from the tape feeder 15. Thus, the component mounting operation for transporting and mounting the light emitting component 20 to and on the board 3 that is positioned and held in the board transport mechanism 2C is performed. In the mounting operation of the light emitting component 20 on the board 3 by the component mount head 11, positioning between the light emitting component 20 and the board 3 is performed based on a recognition result in which a recognizing process of an imaging result of the board 3 is performed by the board recognition camera 12.

Figure 3:
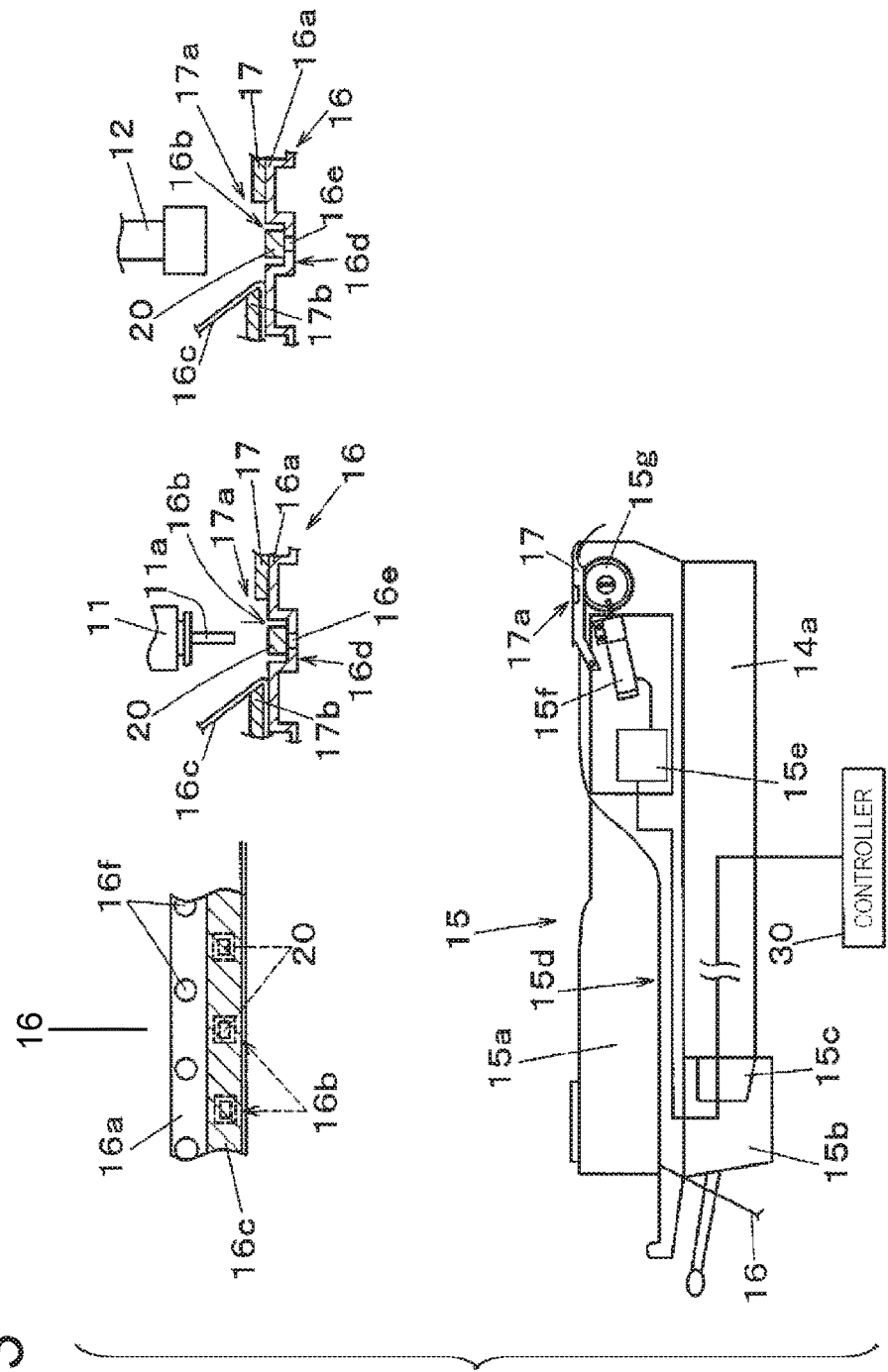
FIG. 3 is an explanatory view of a configuration of a tape feeder mounted on a component mounting apparatus according to an embodiment of the present invention.

Here, a configuration and a function of the tape feeder 15 will be described with reference to FIG. 3. As described above, the tape feeder 15 has the function as the component supply device for supplying the light emitting component 20 to the pick-up position by the component mount head 11 by pitch-feeding the carrier tape 16, to the pocket 16b of which the light emitting component 20 is held. As illustrated in FIG. 3, the tape feeder 15 is configured to include a feeder body section 15a configuring an entire shape of the tape feeder 15 and a mounting section 15b that is provided convexly below from the lower surface of the feeder body section 15a. A connector 15c provided in the mounting section 15b is fitted to a feeder mounting base 14a in a state of mounting the tape feeder 15 in such a manner that a lower surface of the feeder body section 15a is provided along the feeder mounting base 14a. Thus, the tape feeder 15 is fixed and mounted to and on the component supply section 14 (see FIG. 2), and the tape feeder 15 is electrically connected to a controller 30 (see FIG. 5) of the component mounting apparatus M4.

A tape traveling path 15d is provided to communicate with the inside of the feeder body section 15a from an opening of an upstream end portion to the pick-up position by the component mount head 11 in the tape feed direction of the feeder body section 15a. The tape traveling path 15d has a function of guiding tape feed of the carrier tape 16 introduced on the inside of the feeder body section 15a from the upstream side of the feeder body section 15a to the pick-up position by the component mount head 11.

The carrier tape 16 is configured to provide feed holes 16f in a base tape 16a configuring a tape body at predetermined pitches for pitch-feeding the pocket 16b that accommodates and holds the light emitting component 20. An upper surface of the base tape 16a is sealed by a top tape 16c to cover the pocket 16b to prevent the light emitting component 20 from falling from the pocket 16b.

A pitch feed mechanism for pitch-feeding the carrier tape 16 by a sprocket 15g disposed in a downstream end portion of the feeder body section 15a in the tape feeding direction is built in the feeder body section 15a. The pitch feed mechanism includes a tape feed motor 15f for driving the sprocket 15g to rotate and a feeder controller 15e for controlling the tape feed motor 15f. The carrier tape 16 is pitch-fed along the tape traveling path 15d by driving the tape feed motor 15f in a state where a feed pin (not illustrated) provided on an outer periphery of the sprocket 15g is fitted into the feed hole 16f of the carrier tape 16.

A front side of the sprocket 15g in the tape feeding direction is the pick-up position in which the light emitting component 20 within the pocket 16b is taken out by sucking the light emitting component 20 by the suction nozzle 11a of the component mount head 11. A tape pressing member 17 is disposed on an upper surface side of the feeder body section 15a in the vicinity of the pick-up position. The tape pressing member 17 has a function as a guide section for guiding the carrier tape 16 by covering an upper portion of the carrier tape 16. A suction opening section 17a is provided in the tape pressing member 17 corresponding to the pick-up position by the suction nozzle 11a. An upstream end of the suction opening section 17a in the tape feeding direction is a top tape peeling section 17b for peeling the top tape 16c.

The carrier tape 16 is pitch-fed in a state of being pressed against the tape traveling path 15d by the tape pressing member 17. In the course of the carrier tape 16 traveling below the tape pressing member 17, the top tape 16c is peeled from the base tape 16a on an upstream side of a suction position starting from the top tape peeling section 17b by pulling out the top tape 16c on an upstream side in the tape feeding direction. Thus, the light emitting component 20 within the pocket 16b is exposed upward in the suction opening section 17a.

Then, it is possible to image the light emitting component 20 within the pocket 16b by imaging the lower portion by the board recognition camera 12 by moving the board recognition camera 12 to the upper portion of the suction opening section 17a in which the light emitting component 20 within the pocket 16b is exposed. Then, the upper surface of the light emitting component 20 is recognized and it is possible to detect a light emitting part 21 (see FIGS. 10A and 10B) by performing the recognizing process of an imaged result by a component upper surface recognition processing section 33 (see FIG. 5). Furthermore, similarly, it is possible to pick up the light emitting component 20 by sucking and holding the upper surface of the light emitting component 20 by the suction nozzle 11a by performing a component pick-up operation in the component mount head 11 by moving the component mount head 11 above the suction opening section 17a in which the light emitting component 20 within the pocket 16b is exposed.

Figure 4A:
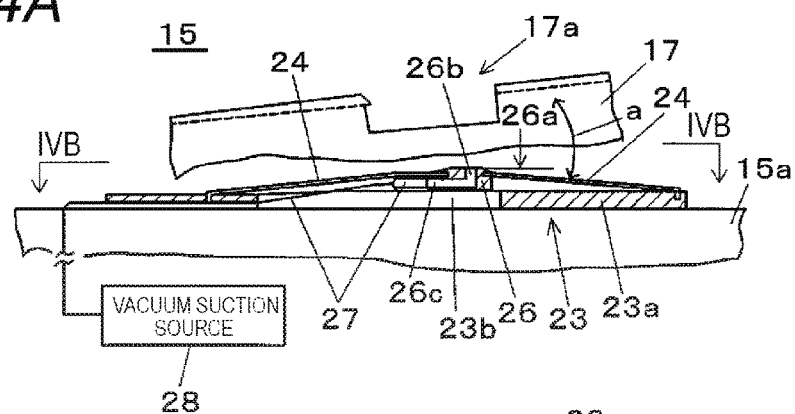
FIGS. 4A to 4C are explanatory views of a configuration of a lower receiving section mounted on a pick-up position of the tape feeder according to an embodiment of the present invention.
Figure 4B:
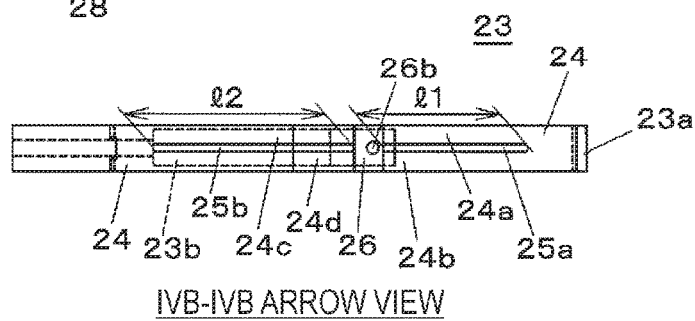
Figure 4C:
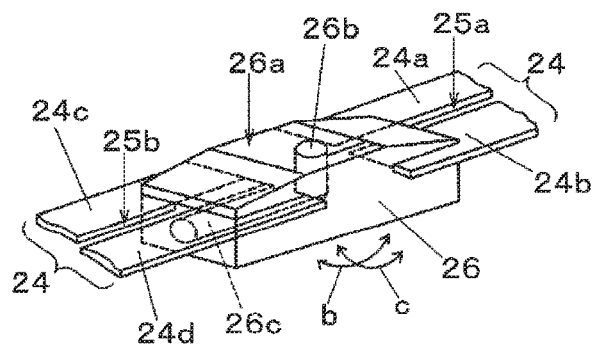

As illustrated in FIGS. 4A to 4C, a lower receiving section 23, which is positioned below the tape pressing member 17 that is a guide member and receives the pocket 16b from the lower surface side, is disposed in a component corresponding to the pick-up position by the suction nozzle 11a on the upper surface of the feeder body section 15a. The tape pressing member 17 is pivotally supplied (not illustrated) to be rotatable (arrow a) relative to the feeder body section 15a. The lower receiving section 23 has a function of receiving the pocket 16b that reaches the suction opening section 17a in the tape feed of the carrier tape 16 from the lower surface side. The carrier tape 16 is guided by being interposed between the tape traveling path 15d and the tape pressing member 17.

A configuration of the lower receiving section 23 will be described. In addition, FIG. 4B illustrates a planar shape (arrow IVB-IVB in FIG. 4A) of the lower receiving section 23. The lower receiving section 23 has an elongated base section 23a as a main body. A notched section 23b is formed in the base section 23a corresponding to a position of the suction opening section 17a of the tape pressing member 17. Two leaf springs 24, which are formed on the upper surface side of the base section 23a by processing a thin member having rich elasticity to an elongated shape and are divided into two parts in front and rear in the tape feeding direction (lateral direction in FIGS. 4A to 4C), are disposed in a form in which each one end portion thereof is fixed and coupled to the base section 23a.

Opposite other ends of the two leaf springs 24 are coupled to a suction section 26 disposed in a state where spatial displacement is allowed at a position corresponding to the suction opening section 17a above the notched section 23b. Since the leaf spring 24 is the thin member having rich elasticity, in a state of being illustrated in FIG. 4A, an upward elastic force is always applied with respect to the suction section 26. Then, in a state where the carrier tape 16 is fed on the upper side of the suction section 26 and the suction section 26 is pressed down, the leaf springs 24 are bent. Thus, the suction section 26 is lowered to a height position corresponding to a thickness of the carrier tape 16 and, in a state of partially fitting into the notched section 23b, the carrier tape 16 is elastically received from the lower side.

The suction section 26 has an abut lower receiving surface 26a having a shape capable of abutting a lower surface of an embossed section 16d forming the pocket 16b of the carrier tape 16 on an upper surface thereof. A section hole 26b is provided in the abut lower receiving surface 26a and the section hole 26b communicates with a section hole 26c which is formed by passing through the inside of the suction section 26. A suction pipe 27 connected to the section hole 26c is connected to a vacuum suction source 28 and a suction target is vacuum-sucked from the suction pipe 27 by driving the vacuum suction source 28. Thus, it is possible to suck and hold the suction target to the abut lower receiving surface 26a by the section hole 26b. That is, the lower receiving section 23 is configured to include the suction section 26 for sucking the light emitting component 20 from below and the leaf springs 24 allowing the suction section 26 to come into contact with a bottom of the embossed section 16d forming the pocket 16b from the lower surface side.

Then, in a state where the vacuum suction source 28 is driven, the suction section 26 comes into contact with the bottom of the embossed section 16d from the lower surface side, the light emitting component 20 is sucked from below through a hole section 16e formed in the bottom of the pocket 16b by the suction section 26, and thereby the light emitting component 20 is held within the pocket 16b with a suction holding force. Thus, the suction section 26 and the vacuum suction source 28 configure a holding unit for sucking and holding the light emitting component 20 within the pocket 16b from below in the tape feeder 15 as the component supply device.

In the embodiment, both recognition of a light emitting part position for recognizing the light emitting part 21 of the light emitting component 20 supplied by the tape feeder 15 by the board recognition camera 12 and taking out of the component for picking up the light emitting component 20 by the component mount head 11 are performed in a state where the light emitting component 20 is held by the holding unit described above within the pocket 16b. Here, as the vacuum suction source 28, an ejector type vacuum generation unit may be configured to be incorporated to every tape feeder 15 and a vacuum generation device may be used as a vacuum generation source for the plurality of tape feeders 15 by providing the vacuum generation device dedicated to a carriage on which the plurality of tape feeders 15 are collectively mounted.

As illustrated in FIG. 4B, in the two leaf springs 24 extending in a front and rear direction by being coupled to the suction section 26, slits 25a and 25b are formed at positions in which both the leaf springs 24 are partially divided into two parts in a width direction in predetermined length ranges 11 and 12 from the suction section 26. Thus, the leaf springs 24 have a form in which a plurality of member pieces 24a, 24b, 24c, and 24d are partially segmented in the vicinity of a portion in which the suction section 26 is interposed therebetween. That is, the leaf springs 24 are segmented into a plurality of pieces by the slits 25a and 25b formed along the tape feeding direction in pitch feeding. The suction section 26 is in a state of being held by the plurality of member pieces 24a, 24b, 24c, and 24d at four positions which are respectively diagonally disposed.

As described above, each member piece is allowed to be displaced by a different bending amount by holding the suction section 26 by the plurality of member pieces 24a, 24b, 24c, and 24d. Thus, the suction section 26 is configured such that inclination deformation (arrow b) in the tape feeding direction and inclination deformation (arrow c) in the tape width direction are respectively allowed to have different deformation amounts, and the abut lower receiving surface 26a can satisfactorily follow a state of the embossed section 16d of a lower receiving target. Thus, each the embossed sections 16d is stably received and held from below, and the light emitting component 20 within the pocket 16b can be stably sucked and held by the suction section 26.

Thus, as the light emitting component 20, even if a component of which the position is difficult to be held with a magnetic attraction force by a magnet member having magnetism is a target, it is possible to stably position and hold the target component within the pocket 16b. Thus, in a case where the position of the light emitting part 21 is detected by imaging the light emitting component 20 within the pocket 16b from above, it is possible to suppress a position error due to the position shift of the light emitting component 20 within the pocket 16b by vibration or the position shift generated when picking up the light emitting component 20 by the suction nozzle 11a.

Figure 5:
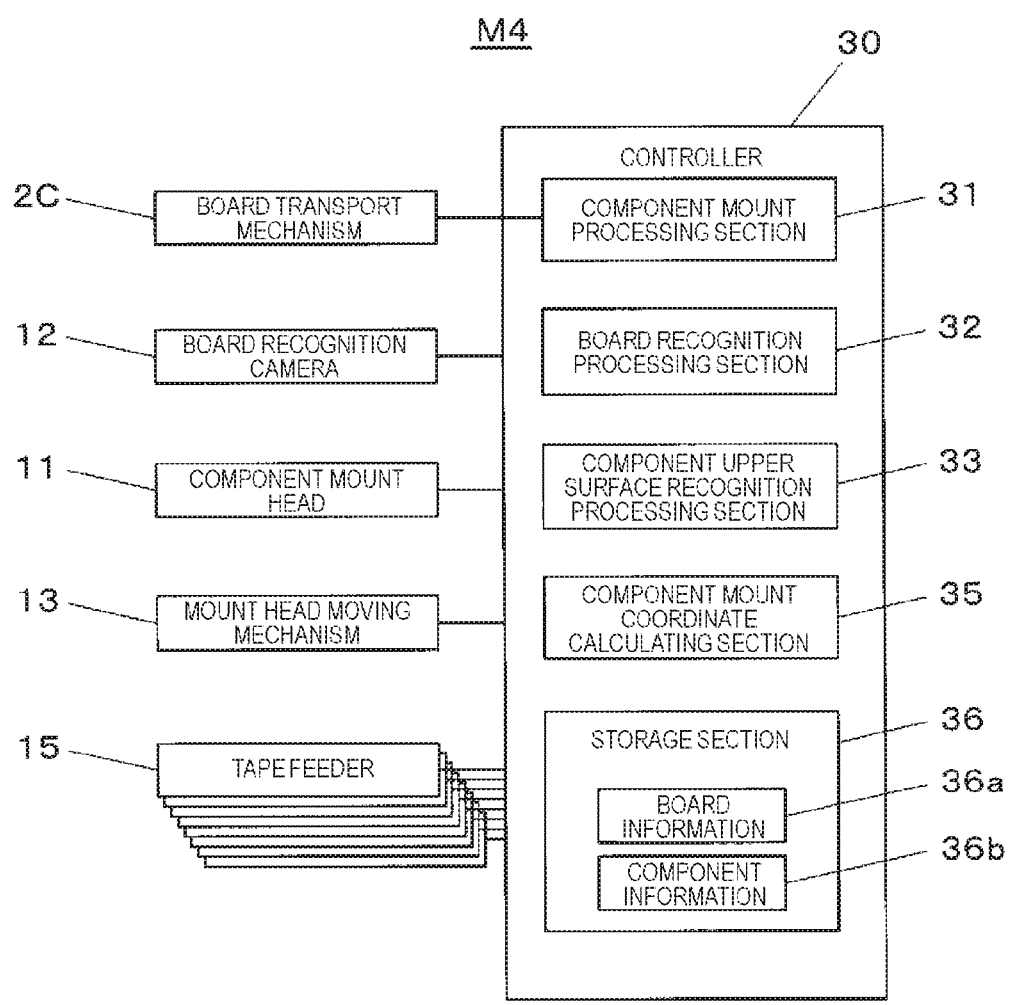
FIG. 5 is a block diagram illustrating a configuration of a control system of the component mounting apparatus according to an embodiment of the present invention.

Next, a configuration of a control system of the component mounting apparatus M4 will be described with reference to FIG. 5. In the component mounting apparatus M4, the controller 30 includes each section of a component mount processing section 31, a board recognition processing section 32, a component upper surface recognition processing section 33, and a component mount coordinate calculating section 35 as an internal processing function, and further includes a storage section 36 for storing board information 36a and component information 36b. The board information 36a and the component information 36b are design information for the board 3 and the light emitting component 20 that are respective mounting operation targets. The board information 36a includes the land 3a, a mount coordinate point 3b, a position coordinate of the board recognition mark 3c, and the like in the board 3. The component information 36b includes a shape of the light emitting component 20 and the like. In addition, the controller 30 is connected to the board transport mechanism 2C, the board recognition camera 12, the component mount head 11 (mount head), the mount head moving mechanism 13, and the tape feeder 15.

The component mount processing section 31 performs a component mounting process for transporting and mounting the light emitting component 20 to the board 3 by taking out the light emitting component 20 from the tape feeder 15 by controlling the board transport mechanism 2C, the component mount head 11, the mount head moving mechanism 13, and the tape feeder 15. In the component mounting process, a result of a component mounting coordinate calculation by the component mount coordinate calculating section 35 described below is referred to.

The board recognition processing section 32 detects a stop position of the board 3 by recognition processing of an imaged result in which the board recognition mark 3c (see FIG. 7B) as a reference part formed in the board 3 is imaged by the board recognition camera 12. Thus, the board recognition camera 12 and the board recognition processing section 32 are a reference part recognizer for recognizing the board recognition mark 3c as the reference part formed in the board 3.

In an imaging operation of the light emitting part 21 formed of the upper surface of the light emitting component 20 by the board recognition camera 12 and a taking-out operation of the light emitting component 20 by the component mount head 11, the component upper surface recognition processing section 33 recognizes a light emitting part position FC of the light emitting part 21 formed on the upper surface of the light emitting component 20 by the recognizing process of the imaged result in which the upper surface of the light emitting component 20 is imaged by the board recognition camera 12 for the light emitting component 20 as the target in a state of being sucked and held by the suction section 26. Thus, the board recognition camera 12 and the component upper surface recognition processing section 33 are a light emitting part recognizer for recognizing the light emitting part 21 of the light emitting component 20 by imaging the light emitting component 20 in a state of being held from below within the pocket 16b by the holding unit from above.

The component mount coordinate calculating section 35 performs a process of calculating the component mounting coordinate for positioning the light emitting part position FC of the light emitting component 20 held in the component mount head 11 to the mount coordinate point 3b of the board 3, based on a recognition processing result by the board recognition processing section 32 and the component upper surface recognition processing section 33. Then, the component mount processing section 31 controls the mount head moving mechanism 13 based on the component mounting coordinate that is calculated. Thus, the suction nozzle of the component mount head 11 which holds the light emitting component 20 is lowered to the board 3 and the light emitting part 21 is positioned at the mount coordinate point 3b that is positioned at a predetermined position of the board 3.

Thus, the component mount coordinate calculating section 35 and the component mount processing section 31 are the mounting controller which picks up the light emitting component 20 in a state of being held in the tape feeder 15 and mounts the light emitting component 20 on the board 3 by the component mount head 11 by controlling the operation of the component mount head 11, based on the recognition result of the board recognition mark 3c by the reference part recognizer and the recognition result of the light emitting part 21 by the light emitting part recognizer.

As described above, the suction nozzle 11a of the component mount head 11 holding the light emitting component 20 is lowered with respect to the board 3 and thereby a terminal 20b of the light emitting component 20 comes into contact with the solder paste S printed in the land 3a. Then, a body section 20a of the light emitting component 20 comes into contact with the adhesive A applied to the board 3 (see (ST3B) illustrated in FIGS. 7A to 7C). Thus, the component mount processing section 31 and the component mount head 11 are a light emitting part mounting section for allowing the terminal 20b of the light emitting component 20 to come into contact with the solder paste S that is printed in the land 3a and the body section 20a of the light emitting component 20 to come into contact with the adhesive A that is applied to the board 3 by lowering the suction nozzle to the board 3.

Here, details of positioning between the light emitting component 20 and the board 3 will be described with reference to FIGS. 6A to 6C and FIGS. 7A to 7C. First, FIGS. 6A to 6C illustrate a state of an ideal component in which the light emitting component 20 is manufactured precisely according to an instruction of design and dimensional errors such as the position shift of each section do not exist. As illustrated in FIG. 6A, the light emitting component 20 has the rectangular body section 20a as a main body where the light emitting part 21 is formed on the upper surface that is a functional surface and the terminals 20b for soldering are formed at both ends of the body section 20a in the longitudinal direction. The light emitting part 21 is configured by covering the upper surface of the LED that is the light emitting source with a phosphor. As an example, the embodiment illustrates a case where the light emitting parts 21 in the light emitting component 20 are symmetrically arranged with respect to a center point of the body section 20a and a component center PC indicating a center position of the light emitting component 20 and the light emitting part position FC indicating a center position of the light emitting part 21 are matched to each other.

FIG. 6B partially illustrates the board 3 on which a plurality of light emitting components 20 are mounted by soldering and a plurality of lands 3a in pairs for soldering are respectively formed in a mounting surface of the board 3. The center position of the lands 3a of each pair is the mount coordinate point 3b that is the target when mounting the light emitting component 20. In the example of the embodiment, it is required that the light emitting part position FC of the light emitting component 20 matches the mount coordinate point 3b in a state where the light emitting component 20 is mounted by soldering.

FIG. 6C illustrates a state where the ideal component illustrated in FIG. 6A is mounted on the board 3. Moreover, in FIGS. 6A to 6C and FIGS. 7A to 7C, the solder paste S for soldering and the adhesive for position fixing are not illustrated. In this state, in the lands 3a of each pair on which the light emitting component 20 is mounted, it is a goal that the light emitting part position FC of each light emitting component 20 matches the mount coordinate point 3b. In this case, as described above, in a case of the ideal component, the light emitting part position FC matches the component center PC. Thus, the goal for a desired positioning is achieved by positioning the component center PC to the mount coordinate point 3b.

Figure 7A:
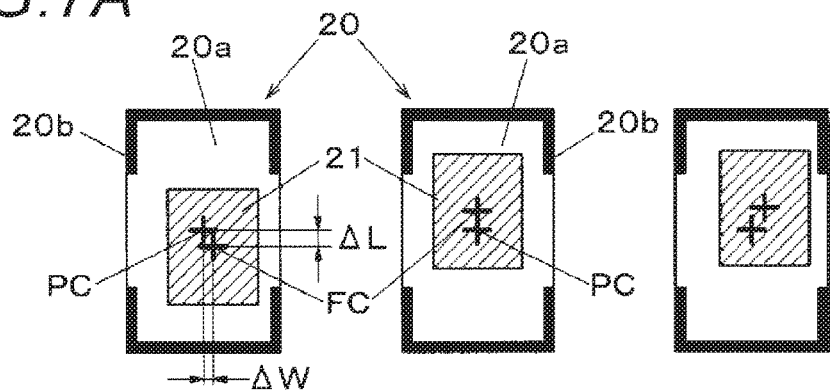
FIGS. 7A to 7C are explanatory views of a reference of mounting positioning in the component mounting method according to an embodiment of the present invention.
Figure 7B:
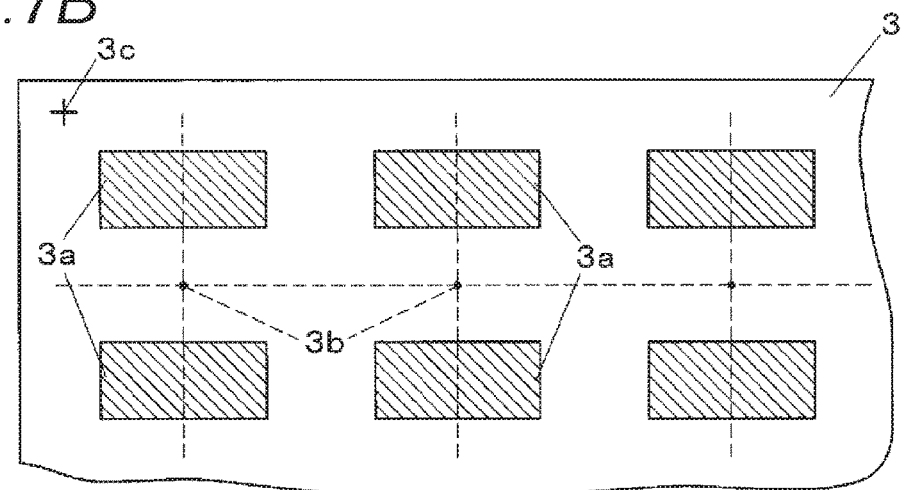
Figure 7C:
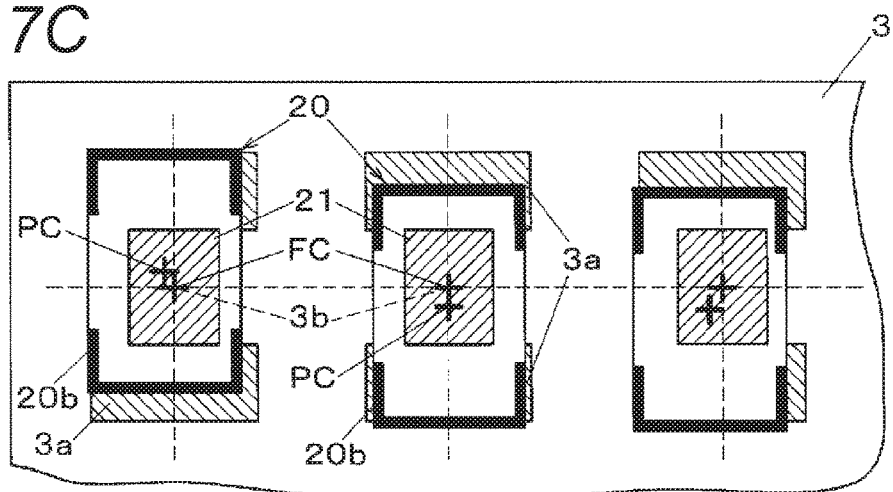

FIGS. 7A to 7C illustrate details of positioning when mounting the light emitting component 20 that is actually used in a production site. In a manufacturing process of the light emitting component 20, position control of the light emitting part 21 with respect to an external shape of the body section 20a is not necessarily exact and deviation of the light emitting part position FC is present in each individual element. For example, as illustrated in FIG. 7A, a position shift ($\Delta L$) in the longitudinal direction and a position shift ($\Delta W$) in the width direction are present between the light emitting part position FC that is the center position of the light emitting part 21 and the component center PC that is the center position of the light emitting component 20 by the position shift when mounting the LED on the body section 20a and the error when cutting the LEDs into pieces after mounting. Thus, when the light emitting component 20 having the position shifts (ΔL and ΔW) is mounted on the positioning reference illustrated in FIG. 6C, that is, the component center PC is mounted to be fitted to the mount coordinate point 3b, the light emitting part position FC to be matched to the original mount coordinate point 3b is in a state of being position-shifted.

In order to solve such a problem, in the component mounting system 1 of the embodiment, the light emitting part position FC is detected by image recognition in the actual light emitting component 20 before mounting of the light emitting component 20 on the board 3. Then, the mounting position of the light emitting component 20 on the board 3 is corrected based on the detected light emitting part position FC and as illustrated in FIG. 7C, the occurrence of the position shift of the light emitting part position FC in the mounted state is prevented, and thereby the light emitting part position FC is matched to the mount coordinate point 3b.

Next, the component mounting method of mounting the light emitting component 20 on the board 3 by soldering by the component mounting system 1 will be described with reference to FIG. 8. Here, an example in which the light emitting component 20 is mounted on the board 3 by picking up the light emitting component 20 from the pocket 16b formed in the carrier tape 16 by the component mount head 11 is illustrated. Moreover, in FIG. 8, a process explanatory view illustrating operation contents is given to each step of a process flow indicating the component mounting method.

First, the board 3 is introduced into the screen printing device M2 and here, screen printing is performed on the board 3 as the target (ST1). That is, the solder paste S is supplied to the lands 3a of the pair formed on the upper surface of the board 3 by screen printing (solder paste supplying process). Next, the board 3 is introduced into the adhesive application device M3 and application of the thermosetting adhesive is performed (ST2).

That is, the adhesive A for fixing the light emitting component 20 to the board 3 is applied on the upper surface of the board 3 between the lands 3a of the pair (adhesive applying process). Here, as the adhesive A, thermosetting adhesive having curing characteristics of which a peak of a curing reaction reaches a temperature lower than a melting point of the solder in the solder paste S is used. Then, the coating position is set to a position coming into contact with the lower surface of the body section 20a of the light emitting component 20 which has been mounted on the upper surface of the board 3 on both sides of the mount coordinate point 3b. Next, the board 3 is introduced into the component mounting apparatus M4 to perform a light emitting component mounting process (ST3) and here, the light emitting part recognition (ST3A) and the light emitting component mounting (ST3B) are performed.

In the light emitting part recognition (ST3A), the component mount head 11 is moved upward the component supply section 14 and the upper surface of the light emitting component 20 which is held in the tape feeder 15 is imaged by the board recognition camera 12 attached to the component mount head 11. Then, the light emitting part position FC is recognized by performing a recognizing process of an imaged result by the component upper surface recognition processing section 33. In the light emitting component mounting (ST3B), the light emitting part position FC is positioned at the mount coordinate point 3b and the light emitting component 20 is mounted on the board 3 by correcting the mounting position based on the recognition result of the recognition of the light emitting part.

In this case, the terminal 20b of the light emitting component 20 comes into contact with the solder paste S printed on the land 3a and the body section 20a of the light emitting component 20 comes into contact with the adhesive A applied to the board 3. In the mounting state, the light emitting component 20 is held on the upper surface of the board 3 in a state where the light emitting part position FC is positioned at the mount coordinate point 3b and, in this state, the board 3 is introduced into the reflow device M5.

In the reflow device M5, heating of the board 3 is performed according to the heating profile that is set in advance and then first, the adhesive A is cured and the light emitting component 20 is fixed to the board 3 (adhesive curing process). In the embodiment, as the adhesive A, thermosetting resin is used and a preheating process of heating the board 3 to a temperature that is less than a melting point of the solder in the solder paste S and a temperature or higher for accelerating the curing reaction of the thermosetting adhesive A corresponds to an adhesive curing process (ST4). The adhesive A is cured by preheating and becomes an adhesive A* for fixing the light emitting component 20 to the board 3.

Next, the board 3 is moved on an inside of the reflow device M5 and thereby the procedure is proceeded to a heating process for soldering according to the heating profile. In the heating process, the solder in the solder paste S is melted (ST5) by the adhesive A* made of the cured adhesive A in a state where the light emitting component 20 is fixed to the board 3 and thereby the terminal 20b of the light emitting component 20 and the land 3a of the board 3 are electrically and mechanically connected (reflow process). The reflowing process is continued from the preheating process and is performed by heating the board 3 to a temperature of the melting point or more of the solder in the reflow device M5.

Then, the solder is solidified and thereby a solder section S* in which the terminal 20b of the light emitting component 20 and the land 3a of the board 3 are coupled and fixed by soldering is formed. In the soldering, since melting of the solder is performed in a state where the light emitting component 20 is fixed to the board 3 by the adhesive A*, a self-alignment operation, in which the terminal 20b is attracted to the land 3a by a surface tension of molten solder in the reflow process, is impeded. Thus, the light emitting component 20 is soldered to the board 3 while maintaining the state of being illustrated in (ST3B) and the light emitting part position FC of the light emitting part 21 and the mount coordinate point 3b of the board 3 are maintained in a state of being accurately positioned even after soldering.

Here, the light emitting component mounting process (ST3) described above performed in the component mounting apparatus M4 will be described with reference to FIG. 9. First, the board 3 to which the solder paste S is printed and the adhesive A is applied is introduced into the component mounting apparatus M4 (ST31). Next, the board recognition mark 3c that is the reference part of the board 3 is imaged and recognized (reference part recognizing process) (ST32). Next, the board recognition camera 12 is moved above the suction opening section 17a of the tape feeder 15, the light emitting component 20 in a state of being sucked and held by the suction section 26 is imaged, and the light emitting part 21 is recognized (light emitting part recognizing process) (ST33).

Figure 10A:
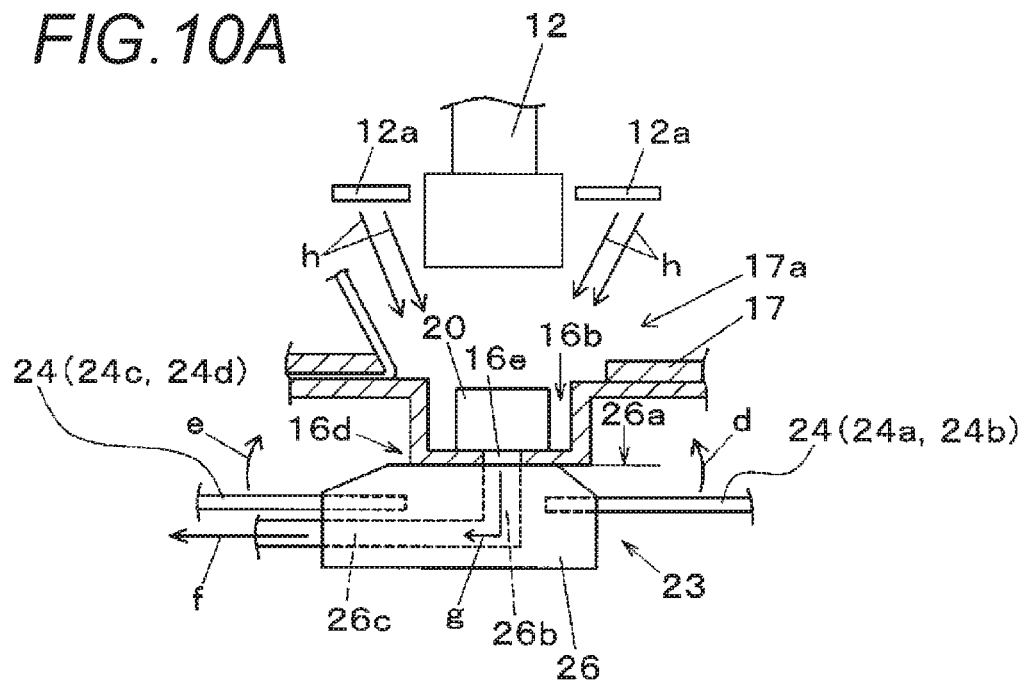
FIGS. 10A and 10B are explanatory views of imaging of a component and recognition of a light emitting part in the component mounting method according to an embodiment of the present invention.

As illustrated in FIG. 10A, in the component imaging, a lighting device 12a included in the board recognition camera 12 is turned on and imaging for recognizing the light emitting part 21 of the upper surface of the light emitting component 20 is performed. In the imaging, the lighting device 12a applies a lighting light (blue) (arrow h) that is suitable for detecting the phosphor used in the light emitting part 21. In the imaging operation, the lower receiving section 23 is provided and the suction section 26 that is repulsive upward by the leaf springs 24 abuts a bottom surface of the embossed section 16d forming the pocket 16b accommodating the light emitting component 20 of the imaging target.

Figure 10B:
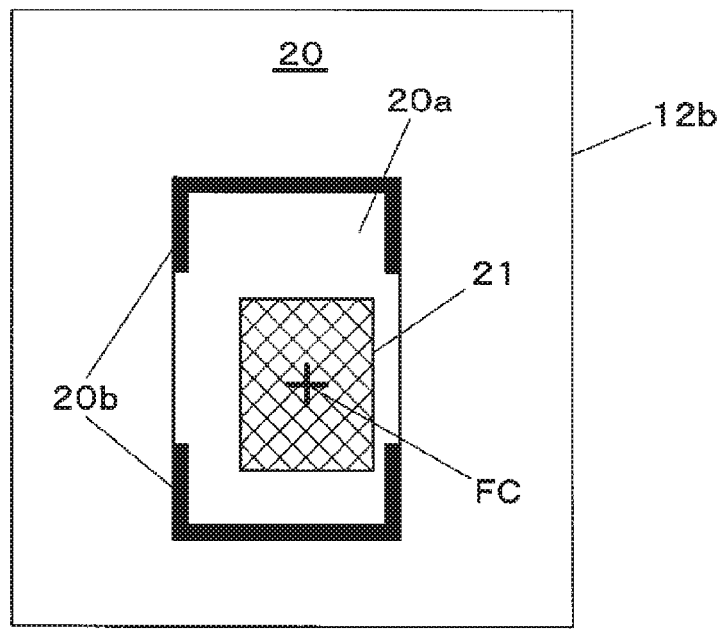

In this case, the section hole 26c is vacuum-sucked by vacuum-sucking (arrow f) the section hole 26c by driving the vacuum suction source 28 (FIGS. 4A to 4C) and thereby the light emitting component 20 is vacuum-sucked from the hole section 16e provided on the bottom surface of the pocket 16b through the section hole 26b. Thus, the light emitting component 20 is sucked and held at a stable position within the pocket 16b, and the board recognition camera 12 can acquire a recognized image in the stable state. FIG. 10B illustrates a recognition screen 12b that is acquired as described above. That is, an image view indicating the upper surface of the light emitting component 20 is illustrated in the recognition screen 12b and as described above, the board recognition camera 12 images the light emitting component 20 by using the lighting light (blue) having the characteristics suitable for recognizing the phosphor of the light emitting part 21. Thus, it is possible to detect the light emitting part 21 that is the detection target in the recognition screen 12b with high recognition precision. Thus, it is possible to detect the light emitting part position FC that is the position reference when mounting the light emitting component 20 with high precision.

Next, the light emitting component 20 in a state of being sucked and held by the suction section 26 is picked up (picking up process) (ST34) by the component mount head 11 based on the recognition result of the light emitting part 21 in (ST33). In the picking up process, similar to the light emitting part recognizing process (ST33), the suction section 26 that is repulsive upward by the leaf springs 24 similarly abuts the bottom surface of the embossed section 16d forming the pocket 16b accommodating the light emitting component 20 of the pick-up target. In this case, the section hole 26c is vacuum-sucked (arrow f) by driving the vacuum suction source 28 (FIGS. 4A to 4C) and thereby the light emitting component 20 is vacuum-sucked from the hole section 16e provided in the bottom surface of the pocket 16b through the section hole 26b. Thus, the light emitting component 20 is held in the stable position similar to the state of the recognition operation illustrated in FIGS. 10A and 10B within the pocket 16b and it is possible to pick up the light emitting component 20 in the stable state.

Figure 11A:
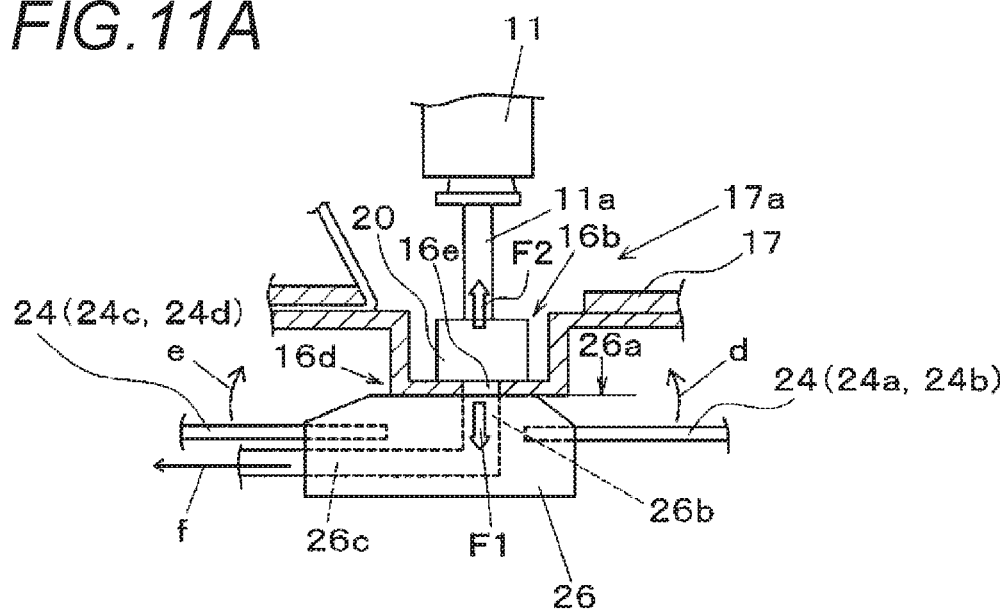
FIGS. 11A to 11C are explanatory views of mounting of the light emitting component in the component mounting method according to an embodiment of the present invention.
Figure 11B:
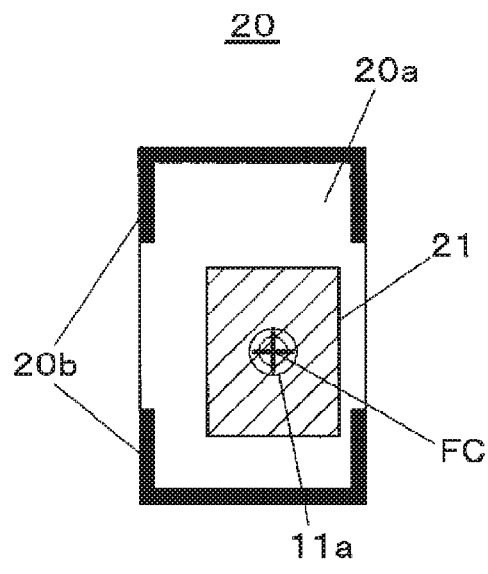

In the component pick-up, as illustrated in FIG. 11B, the light emitting component 20 is picked up by positioning the suction nozzle 11a to the light emitting part position FC that is recognized in (ST33). In the component pick-up operation, a pick-up force F2 of the light emitting component 20 by the suction nozzle 11a is greater than a suction holding force F1 of the light emitting component 20 by vacuum suction of the suction section 26 and thereby setting of dimensions of the hole section 16e and the section hole 26b, and setting of a vacuum suction pressure by the vacuum suction source 28 are performed so as not to hinder normal pick-up. That is, the component mount head 11 that is the mount head picks up the light emitting component 20 with the holding force greater than the holding force by suction by the suction section 26 from below.

Figure 11C:
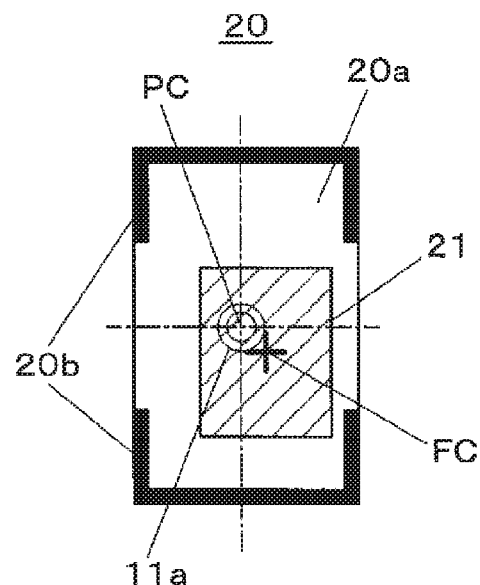

Moreover, a portion (for example, the component center PC illustrated in FIG. 11C) other than the light emitting part position FC may be set as the pick-up target portion instead of pick-up of the light emitting component 20 by positioning the suction nozzle 11a to the light emitting part position FC by characteristics of the light emitting component 20. In this case, an offset amount between the light emitting part position FC and the pick-up target portion recognized in (ST33) is stored and the mounting position is corrected by the offset amount in the following component mounting.

Next, the component mount head 11 that picks up the light emitting component 20 is moved to the board 3 and the pick-up light emitting component 20 is mounted on the board 3 (ST35). In this case, the mounting position control of the component mount head 11 is performed such that the light emitting part position FC recognized in (ST33) matches the mount coordinate point 3b. That is, the light emitting component 20 is mounted on the board 3 based on the recognition result of the board recognition mark 3c that is the reference part and the light emitting part 21 (mounting process).

Then, in a process in which a similar component mounting operation is repeatedly performed, it is determined whether or not the light emitting component 20 to be mounted remains (ST36). Here, if the light emitting component 20 to be mounted remains, the procedure is returned to (ST33) and the same subsequent processing operation is repeatedly performed and if it is determined that there is not the light emitting component 20 to be mounted in (ST36), the component mounting is completed and delivery of the board is performed (ST37). Then, after (ST4), operations illustrated in FIG. 8 are performed.

Thus, even if the variation exists in the light emitting part position in the light emitting component 20, it is possible to mount the light emitting component 20 by accurately positioning the light emitting part 21 to the reference position of the board 3. In addition, it is possible to prevent the movement of the light emitting component 20 by the adhesive A by the self-alignment operation during melting of the solder in the reflow process. It is possible to mount the light emitting component 20 on the board 3 by soldering with high positioning precision.

As described above, in the component mounting apparatus M4 and the component mounting method indicated in the embodiment, when mounting the light emitting component 20 on the board 3 by picking up the light emitting component 20 by the component mount head 11 from the pocket 16b of the carrier tape 16 supplied by the tape feeder 15, the light emitting component 20 in a state of being held within the pocket 16b by the holding unit from below is imaged from above and the light emitting part 21 of the light emitting component 20 is recognized. Similarly, the light emitting component 20 in a state of being held by the holding unit is picked up by the component mount head 11 and the pick-up light emitting component 20 is mounted on the board 3 based on the recognition result in which the reference part of the board 3 is recognized and the recognition result of the light emitting part 21.

Thus, a drawback in the related art in which a second recognizing process for recognizing the light emitting component by imaging the light emitting component from the lower surface side in addition to a first recognizing process for recognizing the light emitting component by imaging the light emitting component from the upper surface side in the mounting process, that is, a drawback that it takes time for imaging and the recognizing process of the light emitting component and it causes lowering of the productivity is eliminated. Furthermore, even if a combination in which both the body section of the light emitting component and the carrier tape are black, and the exterior of the component is unlikely to be optically recognized is the target, in the embodiment, since only the light emitting part 21 is recognized, it is possible to accurately perform the position recognition for positioning the light emitting component 20.

In addition, even if differences occur in the exteriors of the upper surface and the lower surface due to cut-shape precision of the cutting and separating process of the light emitting component into individual pieces, in the embodiment, since the position recognition is not required from the lower surface side, it is not an obstacle to sufficiently secure the mounting precision. Thus, according to the component mounting method and the component mounting apparatus illustrated in the embodiment, even if the light emitting component where variation occurs in the position of the light emitting part is the target, it is possible to secure the mounting precision without performing recognition of the light emitting component from the lower surface side.

Moreover, in the embodiment described above, an example, in which the light emitting component 20 such as the LED is the component mounted on the board 3 supplied by the tape feeder 15 having the configuration illustrated in FIGS. 3 and 4A to 4C, is illustrated, but the supply target of the tape feeder 15 illustrated in the embodiment is not limited to the light emitting component 20. That is, if it is a component of which mounting positioning is necessary to be determined based on a result of the recognition of the reference position being performed by imaging the upper surface of the component in addition to the light emitting component 20, it is possible to be the supply target by the tape feeder 15 having the configuration described above.

Even for the light emitting component in which variation exists in the position of the light emitting part, the component mounting method and the component mounting apparatus of the present invention have effects that the mounting precision can be secured without performing recognition of the light emitting component from the lower surface side of the light emitting component and are useful in a field of manufacturing the lighting board by mounting the light emitting component such as the LED on the board.

What is claimed is:

1. A component mounting method for mounting a light emitting component on a board by picking up the light emitting component from a pocket formed in a carrier tape by a mount head, the method comprising:
   recognizing a reference part formed in the board;
   recognizing a light emitting part of the light emitting component by imaging the light emitting component from above in a state where the light emitting component is held within the pocket by a holder from below;
   picking up the light emitting component by the mount head in the state where the light emitting component is held within the pocket by the holder from below; and
   mounting the picked up light emitting component on the board based on a recognition result of the reference part and a recognition result of the light emitting part,
   wherein the holder holds the light emitting component within the pocket by sucking the light emitting component from below.

2. The component mounting method according to claim 1, wherein the light emitting component is picked up with a holding force that is greater than a holding force by suction of the holder from below.

* * * * *